(12) United States Patent
Strong

(10) Patent No.: US 6,563,381 B1
(45) Date of Patent: May 13, 2003

(54) CIRCUITS AND METHODS FOR EXTENDING THE INPUT COMMON MODE VOLTAGE RANGE OF JFET OP-AMPS

(75) Inventor: Alexander Mark Strong, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/008,637

(22) Filed: Dec. 4, 2001

(51) Int. Cl.[7] .............................. H03F 3/45; H03F 3/16; H03K 5/08
(52) U.S. Cl. .................. 330/253; 330/258; 330/261; 330/300; 327/312
(58) Field of Search ................................ 330/253, 258, 330/261, 300; 327/312, 313

(56) References Cited

U.S. PATENT DOCUMENTS

| | | | | |
|---|---|---|---|---|
| 4,232,271 A | * | 11/1980 | Dobkin et al. | 330/258 |
| 4,378,529 A | * | 3/1983 | Dobkin | 330/257 |
| 5,414,388 A | * | 5/1995 | Sauer | 330/252 |
| 5,537,078 A | | 7/1996 | Strong | |
| 5,825,228 A | | 10/1998 | Gross | |
| 5,952,882 A | * | 9/1999 | Kolluri | 330/255 |
| 6,384,687 B1 | * | 5/2002 | Maida | 330/296 |

OTHER PUBLICATIONS

Karki, Jim, "Understanding Operational Amplifier Specifications", White Paper SLOA011, Digital Signal Processing Solutions, Texas Instruments, Inc., Apr. 1998.
Stitt, R. Mark, "Extending the Common–Mode Range of Difference Amplifiers", Application Bulletin AB–015, Burr–Brown Corporation, Aug. 1990.
National Semiconductor, "LM741 Operational Amplifier", Datasheet, Aug. 29, 2000.
Linear Technology, "LT1124/1125 Dual–Quad Low Noise, High Speed Precision Op Amps," Datasheet, 1992.
Linear Technology, "LT1113 Dual Low Noise, Precision, JFET Input Op Amps," Datasheet, 1993.

* cited by examiner

Primary Examiner—Patricia T. Nguyen
(74) Attorney, Agent, or Firm—Fish & Neave; Mark D. Rowland

(57) ABSTRACT

Circuits and methods for extending the input common mode voltage range of a JFET op-amp are provided. The circuits and methods consist of modifying the input stage of a JFET op-amp to include a BJT pair as the input differential pair and use a JFET pair as followers. Using the BJTs as the input differential pair enables the JFET followers to operate in the linear region of operation when the op-amp's input is approaching ground, thereby increasing the negative common mode voltage range. The positive common mode voltage range is increased by reducing the source current in the JFET pair and using a transistor pair as clamping transistors.

24 Claims, 7 Drawing Sheets

CIRCUITS AND METHODS FOR EXTENDING THE INPUT COMMON MODE VOLTAGE RANGE OF JFET OP-AMPS

FIELD OF THE INVENTION

This invention relates generally to JFET operational amplifiers. More specifically, the present invention provides circuits and methods for extending the input common mode voltage range of JFET operational amplifiers.

BACKGROUND OF THE INVENTION

Operational amplifiers are among the most useful and cost-effective analog electronic devices. With only a handful of external components, operational amplifiers ("op-amps") can be used to perform a variety of mathematical and signal processing operations, including the addition, subtraction, integration, differentiation, and filtering of electronic signals. Depending on the application, op-amps may be selected for speed, noise, output power, and power dissipation. There are many types of op-amps currently available, with each type optimizing different performance parameters.

Modern op-amps are typically designed as linear integrated circuits consisting of three stages: an input stage with a differential input and a differential output, a second or intermediate stage with a differential input and a single output, and an output stage, which usually has unity voltage gain. The input stage amplifies the input voltage difference, the second stage provides frequency compensation, and the output stage provides output drive capability. There are many possible design variations on the structure of the three stages, with the main variations occurring on the devices used in the input stage. The input stage can be built using bipolar transistors (BJTs) for low voltage offset and low voltage noise, MOSFETS for low power operation, or JFETs for high input impedance, low bias current, and low current noise.

The three stages are commonly represented by a single schematic symbol, having two input terminals, referred to as the inverting and non-inverting inputs, an output terminal, and two DC power supplies. For illustrative purposes, a schematic symbol of an op-amp is shown in FIG. 1. The output voltage $V_o$ is simply the difference in voltage between the non-inverting input voltage $V_p$ and the inverting input voltage $V_n$, multiplied by the gain. The differential input and output voltages may be measured with respect to the input common mode voltage, which is a voltage that is common to the inverting and non-inverting inputs of the op-amp. The use of dual power supplies allows the input and output voltages to swing both positive and negative with respect to the input common mode voltage, which acts as the zero reference point.

Ideally, if the two inputs were to be shorted together with an input common mode voltage, thus ensuring zero voltage difference between them, there should be no change in the output voltage. That is, as the input common mode voltage is varied, the output voltage should hold absolutely steady. In practice, however, this is not easily attained. The input common mode voltage will invariably have some effect on the op-amp's output voltage.

The performance of a real op-amp in this regard is most commonly measured in terms of its input common mode voltage range, which is the range of the input common mode voltage over which the op-amp is guaranteed to operate as a linear amplifier, and the common mode rejection ratio (CMRR), which is a measure of the ability of the op-amp to reject common-mode signals, i.e., signals that are simultaneously present at both inputs. The function of an op-amp is to amplify only the differential portion of the input voltages while rejecting the input common mode voltage. If the input common mode voltage varies beyond the input common mode voltage range, the inputs will shut down and proper operation ceases, i.e., the op-amp will be saturated.

The input common mode voltage range is an op-amp characteristic that depends on several factors, including the design used for the input stage. For example, the bipolar-based LM741 op-amp manufactured by National Semiconductor Corporation, of Santa Clara, Calif., and the LT1124 op-amp manufactured by Linear Technology Corporation, of Milpitas, Calif., have a guaranteed input common mode voltage range of +/−12 Volts for a supply voltage of +/−15 Volts, while the FET-based LT1113 manufactured by Linear Technology Corporation, of Milpitas, Calif., has a guaranteed input common mode voltage range of −10.5 to 13 Volts for a supply voltage of +/−15 Volts. The higher the input common mode voltage range of the op-amp, the longer the op-amp stays in the linear operating region.

Increasing the input common mode voltage range of an op-amp, however, often comes at the sacrifice of other performance characteristics, such as offset voltage, offset drift, and noise. In particular, JFET op-amps may suffer from phase inversion if the input common mode voltage approaches either supply too closely. When this occurs, the inverting and non-inverting input terminals reverse functions and the output may reverse direction.

In view of the foregoing, it would be desirable to provide circuits and methods for extending the input common mode voltage range of JFET op-amps.

It also would be desirable to provide circuits and methods for extending the input common mode voltage range of JFET op-amps while avoiding phase inversion, increase in input bias current, and changes in output polarity.

SUMMARY OF THE INVENTION

In view of the foregoing, it is an object of the present invention to provide circuits and methods for extending the input common mode voltage range of JFET op-amps.

It also is an object of the present invention to provide circuits and methods for extending the input common mode voltage range of JFET op-amps while avoiding phase inversion, increase in input bias current, and changes in output polarity.

These and other objects of the present invention are accomplished by providing circuits and methods for extending the input common mode voltage range of a JFET op-amp by modifying the input stage of the JFET op-amp. In a preferred embodiment, the input stage of the JFET op-amp is modified to include a BJT pair as the input differential pair and use the JFET pair as followers. Using the JFETs as followers enables the BJT differential pair to remain in the same region of operation over the entire common mode voltage range. The negative common mode voltage range increases when the JFET followers change from the saturation region of operation to the linear region of operation. The positive common mode voltage range is increased by reducing the source current in the JFET followers and using an additional transistor pair as clamping transistors.

Advantageously, the present invention enables a JFET op-amp to have an extended input common mode voltage range while keeping the bandwidth constant and avoiding phase inversion and other performance drawbacks commonly associated with a wider common mode voltage range.

BRIEF DESCRIPTION OF THE DRAWINGS

The foregoing and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
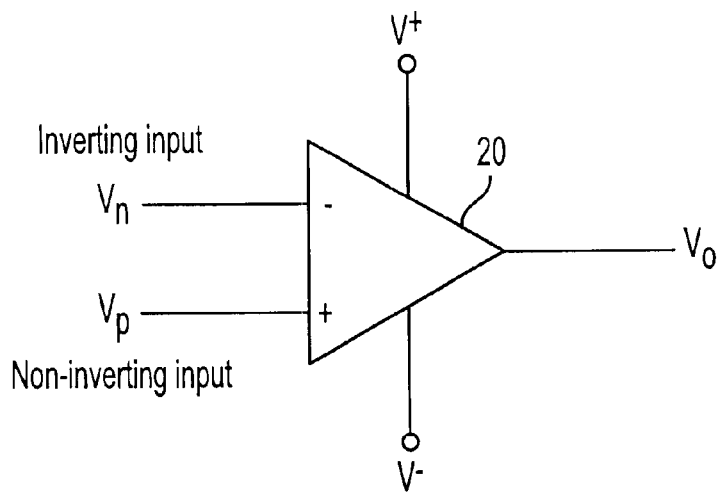
FIG. 1 is a schematic symbol of an op-amp.
Figure 2:
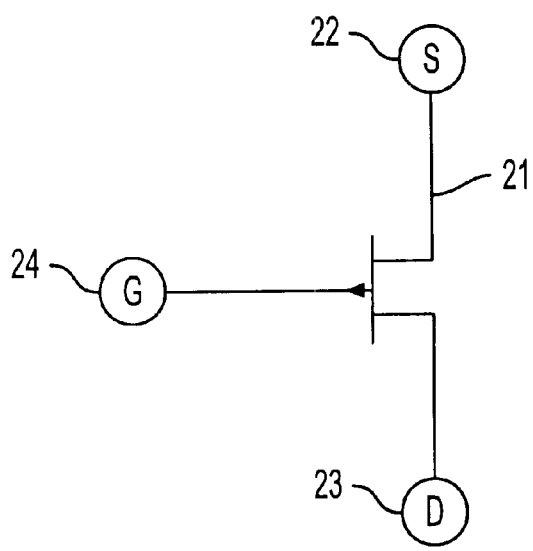
FIG. 2 is a schematic diagram of a conventional p-channel JFET.

Referring to FIG. 2, a schematic diagram of a conventional p-channel JFET is described. JFET 21 is a three-terminal device in which current is conducted by charge carriers (holes) flowing through one type of semiconductor (p-type in p-channel JFETs). The basic structure of JFET 21 consists of a region of p-type silicon with n-type silicon diffused on both sides. The p-type region is called the channel, while the n-type regions are electrically connected together and form the gate. Metal contacts are made to both ends of the channel to form terminals 22 and 23, respectively called source (22) and drain (23). Similarly, a metal contact is made to the n-type region to provide gate terminal 24.

The physical diameter of the channel is fixed, but its effective electrical diameter can be varied by the application of a voltage in gate 24. The voltage applied to gate 24 alters the width and the resistance of the channel, thereby altering the resistance and the current flow between source 22 and drain 23. Current flows in JFET 21 from source 22 to drain 23. The magnitude of this drain current, commonly referred to as Id, is proportional to the voltage applied to gate 24. A small change in gate voltage can cause a large variation in the drain current, thereby making JFETs useful amplification devices.

Figure 3A:
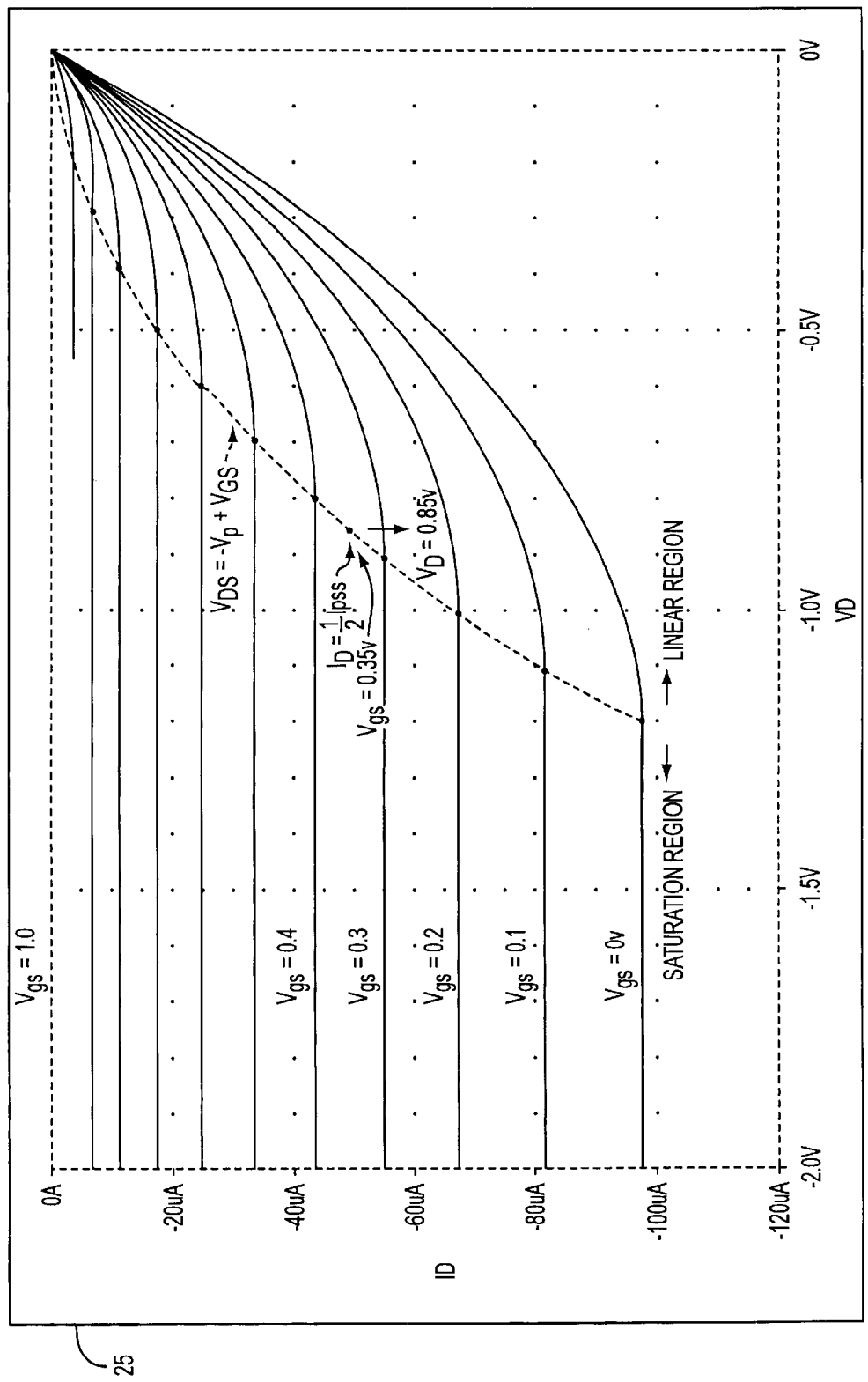
FIG. 3A is a graph of the JFET drain current versus the JFET drain-to-source voltage.
Figure 3B:
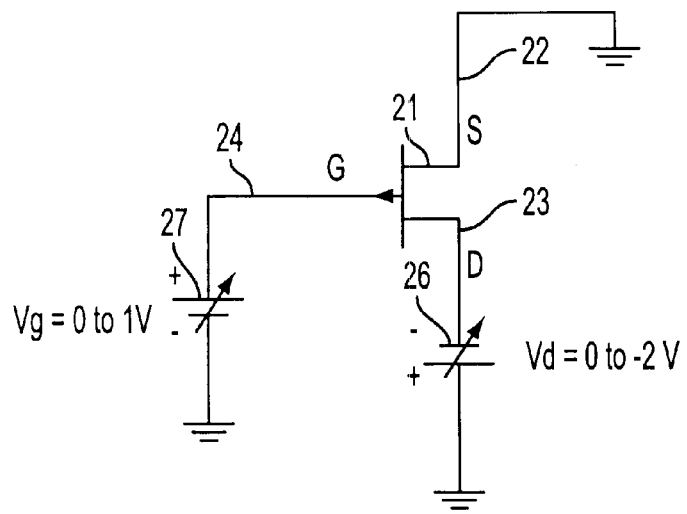
FIG. 3B is a schematic diagram of the p-channel JFET configuration used to generate the graph shown in FIG. 3A.

Referring now to FIG. 3A, a graph of the JFET drain current versus the JFET drain-to-source voltage is described. A schematic diagram of the p-channel JFET configuration used to generate graph 25 is shown in FIG. 3B. A voltage source Vg (gate voltage, 27) ranging from 0 to 1 V is applied to gate 24, source 22 is connected to ground, and a voltage source Vd (drain voltage, 26) ranging from 0 to −2 V is applied to drain 23. As a result of applying the drain voltage Vd to drain 23 and the gate voltage Vg to gate 24, drain current Id flows from source 22 to drain 23. The operation of JFET 21 is best understood by analyzing the drain current Id as a function of the drain-to-source voltage Vds and the gate-to-source voltage Vgs.

Graph 25 shows how the drain current Id varies as a function of the drain-to-source voltage Vds when the gate-to-source voltage Vgs is held constant. For small negative values of Vds, the channel is almost completely open and the drain-to-source resistance is essentially constant and independent of Vds. As a result, the magnitude of the drain current Id increases approximately linearly with |Vds|. As |Vds| increases further, the channel begins to narrow more and more, causing the drain-to-source resistance to increase. The magnitude of the drain current Id continues to increase, but this time the increase is no longer linear, as shown in the downward curves in graph 25.

When Vds is equal to about −1.2 V, the channel becomes so narrow that it essentially pinches off. The n-type depletion regions then meet at the center of the channel forming a pinch-off region. Even as the magnitude of the drain-to-source voltage Vds increases, the pinch-off region is kept at about −1.2 V. This voltage is commonly referred to as the pinch-off voltage or Vp. The length of the pinch-off region increases only slightly as |Vds| increases, so that the resistance of the undepleted, i.e., non pinch-off, portion of the channel is kept approximately constant. As a result, Id is also kept constant.

JFET 21 is then said to operate in its "saturation region." The saturation region is defined based on the value of the gate-to-source voltage Vgs. JFET 21 is said to be in saturation when Vds>Vgs−Vp. Otherwise, JFET 21 is said to operate in its "linear region." The positions on graph 25 where the transition from the linear region to the saturation region occurs are those points where Vds=Vgs−Vp. Using the definition that Idss is the current that flows in JFET 21 when Vgs=0, the mathematical relationship between Id and Vgs is commonly expressed as:

$$Vgs = Vp\left(1 - \sqrt{\frac{Id}{Idss}}\right)$$

Figure 4B:
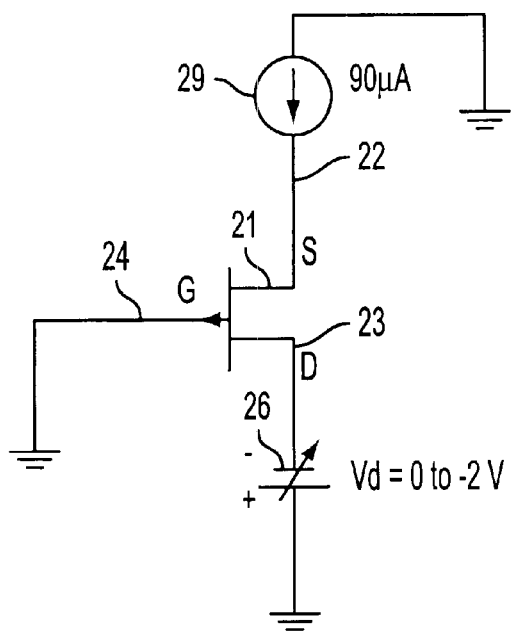
FIG. 4B is a schematic diagram of the p-channel JFET configuration used to generate the graph shown in FIG. 4A.
Figure 4A:
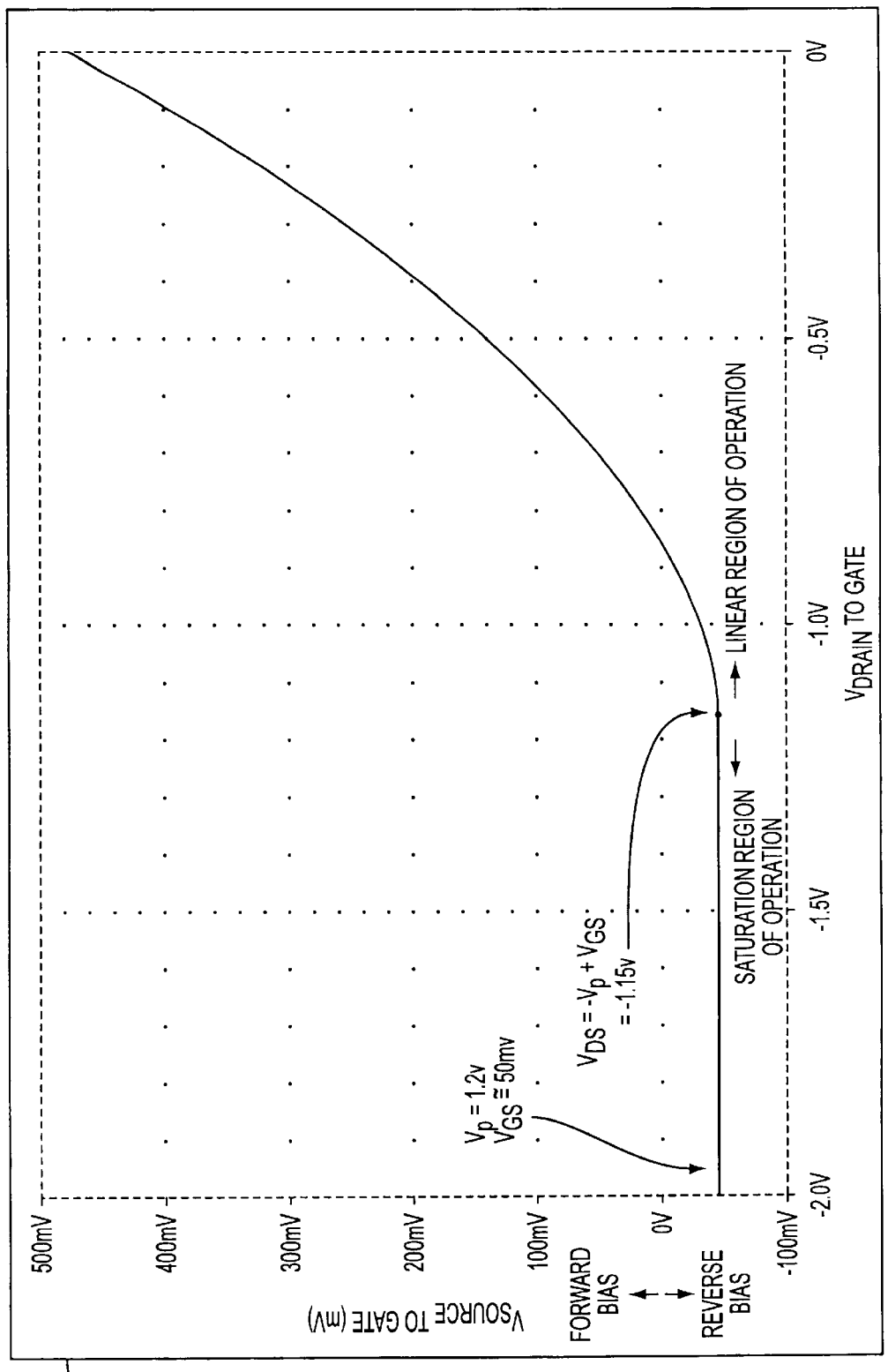
FIG. 4A is a graph of the JFET source-to-gate voltage versus the JFET drain-to-gate voltage.

Referring now to FIG. 4A, a graph of the JFET gate-to-source voltage versus the JFET gate-to-drain voltage is described. A schematic diagram of the p-channel JFET configuration used to generate graph 28 is shown in FIG. 4B. A constant current source I (29) generating 90 μA is applied to source 22, gate 24 is connected to ground, and a voltage source Vd (drain voltage, 26) ranging from 0 to −2 V is applied to drain 23.

Graph 28 shows how the gate-to-source voltage Vgs, varies as a function of the gate-to-drain voltage Vgd. Initially, when Vgd=0, Vgs is positive and determined solely based on current source 29 and the resistance of the channel. As the gate-to-drain voltage Vgd is reduced from 0 to negative Volts, the channel becomes narrower and the drain-to-source resistance increases, causing the source voltage to increase and the gate-to-source voltage Vgs to decrease. When Vgd is negative enough to cause JFET 21 to hit its pinch-off point, i.e., when Vds=Vgs−Vp, the gate-to-source voltage Vgs stops decreasing and becomes constant with further reductions in Vgd.

When Vgs=0 V, i.e., when Id=Idss, the gate-to-source (np) junction becomes forward-biased, and continues to be forward biased for Vgs>0 V. As a result, a portion of the source current I will flow out of the gate. That is, when Vgs≦−0.5 V, the gate-to-source junction of JFET 21 acts as a forward-biased diode.

Figure 5:
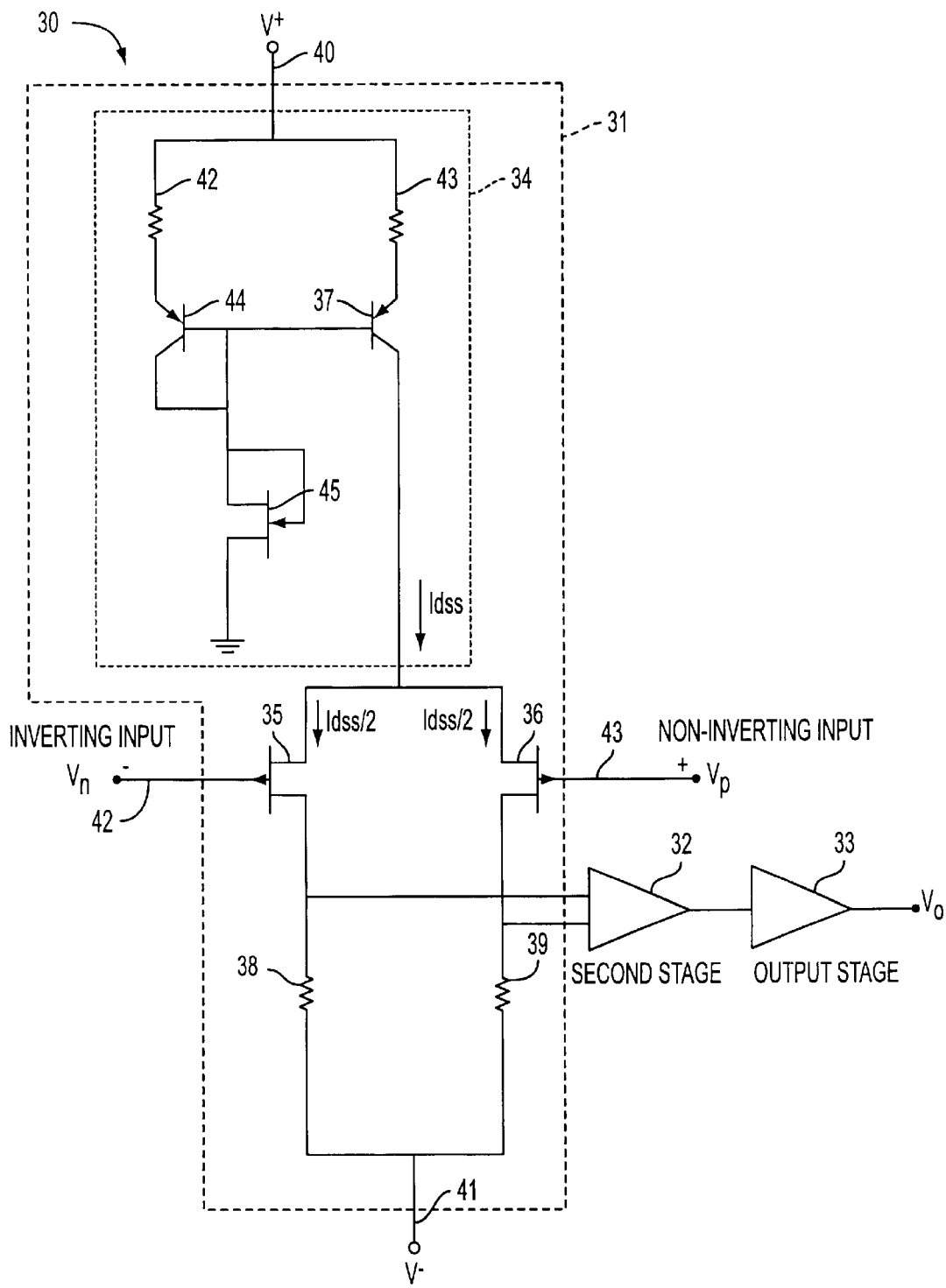
FIG. 5 is a schematic diagram of an illustrative prior art JFET op-amp.

Referring now to FIG. 5, a schematic diagram of an illustrative prior art JFET op-amp is described. JFET op-amp 30 is a 3-stage op-amp, consisting of input stage 31, second stage 32, and output stage 33. It should be understood by one skilled in the art that second stage 32 and output stage 33 may be combined into a single stage.

Input stage 31 of JFET op-amp 30 has bipolar-based current mirror 34 to provide a JFET-dependent current such as Idss to the JFET input differential pair formed by JFET 35 and JFET 36. The gate of JFET 35 is inverting input 42 of op-amp 30, and the gate of JFET 36 is non-inverting input 43 of op-amp 30. Op-amp 30 also has power supplies 40 and 41.

The sources of JFET 35 and JFET 36 are tied to bipolar transistor 37, so that each of JFET 35 and JFET 36 are fed a current of Idss/2. This guarantees that JFETs 35 and 36 operate at less than Idss, keeping the gate to source junction from forward biasing, as described above with reference to FIG. 4A. JFETs 35 and 36 are prevented from forward biasing to avoid a drop in the slew rate of JFET op-amp 30. The slew rate is the rate of change of the output voltage of op-amp 30. A fast slew rate makes op-amp 30 suitable for use in a variety of circuits, including rectifier circuits, peak detector circuits, pulse amplifying circuits, and sample and hold circuits.

The input common mode voltage range of JFET op-amp 30 specifies the range over which op-amp 30 is guaranteed to be in its linear region of operation. With the inputs of op-amp 30 tied to the gates of JFETs 35 and 36, the input common mode voltage range of op-amp 30 becomes limited by the biasing requirements of JFETs 35 and 36. Since JFETs 35 and 36 are reverse-biased and operating at Idss/2, the input common mode voltage range is specified by the difference between the gate voltage Vg and the voltage applied to power supplies 40 and 41.

The gate voltage Vg can be determined by first computing the gate-to-source voltage Vgs, which in the case of JFETs 35 and 36 operating at Idss/2, is equal to:

$$Vgs = Vp\left(1 - \sqrt{\frac{Idss}{2Idss}}\right) = 0.29 \times Vp$$

For the case when JFETs 35 and 36 emulate JFET 21 shown in FIG. 2 with characteristic curves shown in FIGS. 3A and 4A, Vp=−1.2 V. That is, Vgs=0.35 and the drain-to-source voltage Vds required to put JFETs 35 and 36 in the saturation region is equal to Vds=Vgs−Vp=−0.85 V.

The minimum negative common mode voltage range is then the sum of the voltage across the load, −Vds, and the gate-to-source voltage Vgs. Using resistor loads 38 and 39 of 2 KΩ, the voltage across the load is of 200 mV, giving a minimum negative common mode voltage range of 0.35V+0.85V+200 mV=1.4 V. That is, when the gates of JFETs 35 and 36 are 1.4 Volts from negative power supply 41, JFETs 35 and 36 will leave the saturation mode of operation and enter the linear mode of operation.

As a result, the source voltage of JFETs 35 and 36 will go positive with respect to the gate voltage because JFETs 35 and 36 are exiting the saturation region of operation and entering the linear region of operation and, eventually, the gate to source junction will become forward biased, as described with reference to FIG. 4A. This will rob input stage 31 of the current needed to slew op-amp 30 and change the bias conditions in load resistors 38 and 39 and second stage 32.

Figure 6:
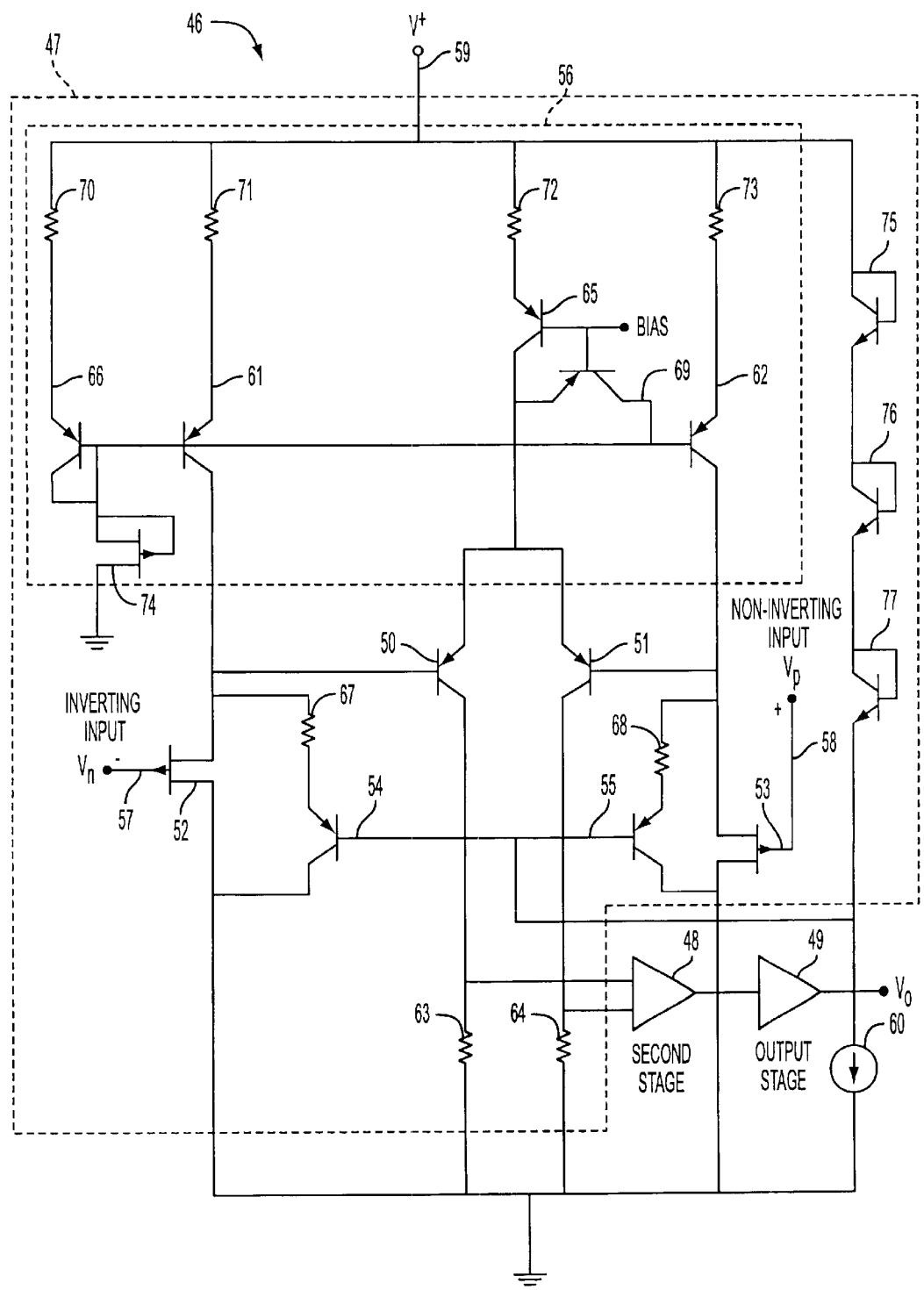
FIG. 6 is a schematic diagram of a JFET op-amp built in accordance with the principles of the present invention to have a wider input common mode voltage range than the JFET op-amp shown in FIG. 5.

Referring now to FIG. 6, a schematic diagram of a JFET op-amp built in accordance with the principles of the present invention to have a wider input common mode voltage range than the JFET op-amp shown in FIG. 5 is described. JFET op-amp 46 is a 3-stage op-amp, consisting of input stage 47, second stage 48, and output stage 49. It should be understood by one skilled in the art that second stage 48 and output stage 49 may be combined into a single stage.

To increase the input common mode voltage range of op-amp 30 shown in FIG. 5 without causing phase inversion and slew rate and bandwidth reduction, input stage 31 of JFET op-amp 30 is modified to include BJT pair 50–51 as the input differential pair of op-amp 46 and use JFETs 52–53 as followers for BJT pair 50–51. Using BJTs 50–51 as the input differential pair allows JFET followers 52–53 to operate in the linear region of operation when the input of op-amp 46 is approaching ground, thereby increasing the negative common mode voltage range without changing the bandwidth and the gain of input differential pair 50–51. The positive common mode voltage range is increased by reducing the source current in JFET followers 52–53 and using additional BJT transistor pair 54–55 as clamping transistors. It should be understood by one skilled in the art that diodes, BJTs, MOSFETs, and n-JFET or p-JFET transistors may also be used as clamping transistors.

Input stage 47 of JFET op-amp 46 has current source 65 to provide a tail current to BJT input differential pair 50–51 and current sources 61 and 62 to provide a JFET-dependent current to JFET followers 52–53. The gate of JFET 52 is inverting input 57 of op-amp 46, and the gate of JFET 53 is non-inverting input 58 of op-amp 46. Op-amp 46 also has power supply rail 59 and constant current source 60.

The drains of JFET followers 52–53 are connected directly to ground to allow an increase in the negative common mode voltage range. The increase in negative common mode voltage range is achieved by biasing current sources 61–62 close to the Idss current of JFETs 52–53. In this case, the gate voltage at the gates of JFETs 52–53 is approximately the same as the source voltage of JFETs 52–53 connected to the bases of BJT differential pair 50–51. The gate, source, and base voltages will track each other over most of the common mode voltage range.

When the gates of JFETs 52–53 go directly to ground and are at the same potential as the drains, JFETs 52–53 enter the linear region of operation. The voltage at the sources of JFETs 52–53 will then rise positive, i.e., increase, with respect to the voltage at the gates, keeping the voltage at the bases of BJT pair 50–51 positive. That is, the change in base to collector voltage of BJT pair 50–51 is less than the change in gate to drain voltage of JFETs 52–53.

As a result, BJT pair 50–51 will be kept out of saturation if the rise of source to gate voltage in JFETs 52–53 is of the same order of magnitude as the voltage drop across load resistors 63–64. This occurs whenever JFETs 52–53 enter the linear region of operation, which is when the input common mode voltage is at the negative rail voltage. This results in an increase in the negative common mode voltage range.

The positive common mode voltage range is limited by the base-to-emitter voltage (Vbe) of BJT pair 50–51 plus the voltage needed to keep current source 65 out of saturation. Current source 65 saturates before current sources 61–62 due to the Vbe drop in BJT pair 50–51, independent of how the gate-to-source voltages of JFET followers 52–53 are biased. Therefore, the positive common mode voltage range is limited only by the saturation voltage of current source 65, the Vbe drop of BJT pair 50–51, and the Vgs of JFET followers 52–53.

To increase the positive common mode voltage range, JFETs 52–53 need to be biased to less than Idss to increase the Vgs of JFETs 52–53 so that the Vbe drop of BJT pair 50–51 will not saturate current source 65. Since they're already biased close to Idss for lowest noise performance and for extended negative common mode voltage range, this is done by reducing their drain currents. Reducing the drain currents of JFETs 52–53 also results in an increase in their gate-to-source voltage, Vgs. The drain current is reduced by shunting the current from current source 61–62 away from JFETs 52–53 by using BJT transistor pair 54–55 as clamping transistors. It should be understood by one skilled in the art that diodes, BJTs, MOSFETs, and n-JFET or p-JFET transistors may also be used as clamping transistors.

Clamping transistors 54–55 enable a portion of the currents from current sources 61 and 62 to flow through resistors 67 and 68 as the voltage at the gates of JFETs 52–53 approach the voltage at positive power supply rail 59. As a result, current source 65 will start to saturate. When this happens, the collector-base junction of current source 65 will forward bias and the collector will emit current to the substrate. By placing a collector ring, i.e., transistor 69, around the collector of current source 65, most of the emitted current that would flow to the substrate is diverted away from the substrate to reduce the current in current sources 61 and 62. As a result, the gate-to-source voltage of JFET followers 52–53 is increased, thereby increasing the positive common mode voltage range.

Figure 7:
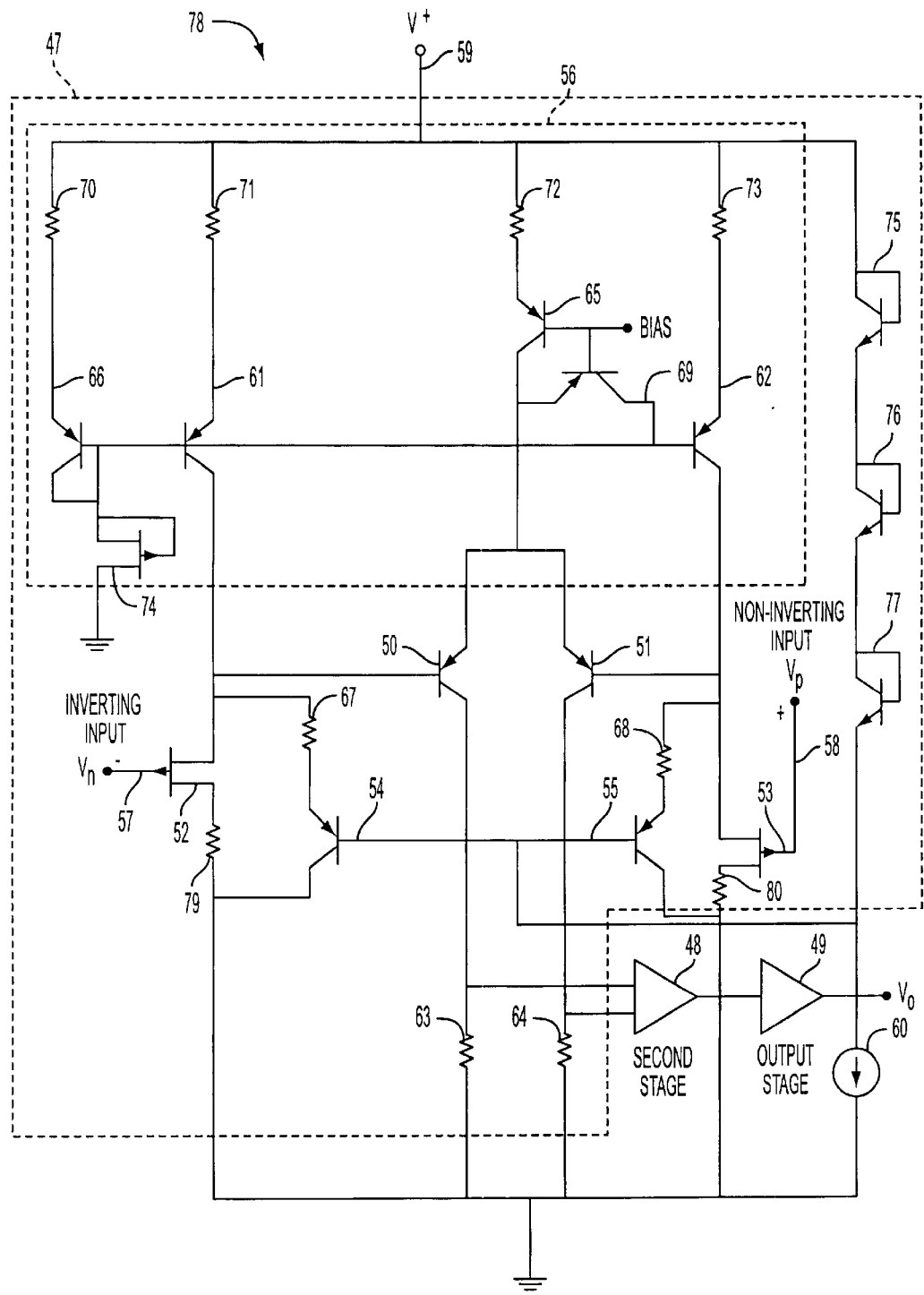
FIG. 7 is a schematic diagram of the JFET op-amp shown in FIG. 6 with two additional resistors to optimize the common mode rejection ratio of the op-amp.

Referring now to FIG. 7, a schematic diagram of the JFET op-amp shown in FIG. 6 with two additional resistors to optimize the common mode rejection ratio of the op-amp is described. JFET op-amp 78 is built similarly to op-amp 46 of FIG. 6, with the addition of resistors 79 and 80 to the drains of JFETs 52 and 53, respectively. Resistors 79 and 80 are added to control changes in the offset voltage, thereby improving the common mode rejection ratio of op-amp 46. The resistance of resistors 79 and 80 as well as the resistance of resistors 71 and 73 may be varied to control the offset voltage and maintain transistors 50–53 in the linear region of operation.

It should be understood by one skilled in the art that the circuits and methods of the present invention described in conjunction with the p-channel JFET op-amps shown in FIGS. 6 and 7 may also be used to extend the common mode voltage range of n-channel JFET op-amps by changing the p-channel JFETs in FIGS. 6 and 7 to n-channel JFETs, by using an npn differential BJT pair in place of pnp BJT pair 50–51, and by reversing the appropriate signs and polarity when necessary.

Although particular embodiments of the present invention have been described above in detail, it will be understood that this description is merely for purposes of illustration. Specific features of the invention are shown in some drawings and not in others, for purposes of convenience only, and any feature may be combined with other features in accordance with the invention. Steps of the described processes may be reordered or combined, and other steps may be included. Further variations will be apparent to one skilled in the art in light of this disclosure and such variations are intended to fall within the scope of the appended claims.

What is claimed is:

1. A method for improving the input common mode voltage range of a JFET op-amp, the JFET op-amp having an inverting and an non-inverting input and a plurality of current sources, the method comprising:

providing a JFET op-amp having a BJT input differential pair and a JFET pair connected as followers for the BJT pair;

maintaining the JFET pair in a linear region of operation when the inputs of the JFET op-amp approach ground;

providing a clamping transistor pair to reduce a source current in the JFET pair; and diverting a saturating current from a BJT current source from the plurality of current sources to increase the gate-to-source voltage of the JFET pair.

2. The method of claim 1, wherein the plurality of current sources comprise one or more BJT current sources and one or more BJT current mirrors.

3. The method of claim 1, wherein the non-inverting input and the inverting input are connected to the gates of the JFET pair.

4. The method of claim 1, wherein the sources of the JFET pair are connected to the bases of the BJT pair.

5. The method of claim 1, wherein the drains of the JFET pair are connected to variable resistors.

6. The method of claim 1, wherein maintaining the JFET pair in the linear region of operation comprises biasing the drain current of the JFET pair at a fraction of Idss.

7. The method of claim 1, wherein the collectors of the clamping transistor pair are connected to the drains of the JFET pair.

8. The method of claim 1, wherein diverting the saturating current from a BJT current source from the plurality of current sources to increase the gate-to-source voltage of the JFET pair comprises providing a collector ring around the BJT current source.

9. The method of claim 1, wherein diverting the saturating current from a BJT current source from the plurality of current sources to increase the gate-to-source voltage of the JFET pair comprises providing a BJT transistor having an emitter connected to the collector of the current source, a base connected to the base of the current source, and a collector connected to the collector of the current source.

10. A JFET op-amp circuit having an extended input common mode voltage range, the JFET op-amp circuit having an inverting and an non-inverting input and a plurality of current sources, the circuit comprising:

a BJT input differential pair;

a JFET pair connected as followers for the BJT pair;

a clamping transistor pair to reduce a source current in the JFET pair; and a BJT collector ring around a BJT current source from the plurality of current sources.

11. The circuit of claim 10, wherein the plurality of current sources comprise one or more BJT current sources and one or more BJT current mirrors.

12. The circuit of claim 10, wherein the non-inverting input and the inverting input are connected to the gates of the JFET pair.

13. The circuit of claim 10, wherein the sources of the JFET pair are connected to the bases of the BJT pair.

14. The circuit of claim 10, wherein the drains of the JFET pair are connected to variable resistors.

15. The circuit of claim 10, wherein the drain current of the JFET pair is biased at a fraction of Idss.

16. The circuit of claim 10, wherein a resistor pair is placed between the sources of the JFET pair and the emitters of the clamping transistor pair.

17. The circuit of claim 10, wherein a load resistor pair is connected to the collectors of the BJT pair.

18. A JFET op-amp circuit having an extended input common mode voltage range, the JFET op-amp circuit having an inverting and an non-inverting input and a plurality of current sources, the JFET op-amp circuit comprising:
   a BJT input differential pair;
   a JFET pair connected as followers for the BJT pair;
   means for maintaining the JFET pair in a linear region of operation when the inputs of the JFET op-amp circuit approach ground;
   means for reducing a source current in the JFET pair; and
   means for diverting a saturating current from a BJT current source from the plurality of current sources to increase the gate-to-source voltage of the JFET pair.

19. The circuit of claim 18, wherein the plurality of current sources comprise one or more BJT current sources and one or more BJT current mirrors.

20. The circuit of claim 18, wherein the non-inverting input and the inverting input are connected to the gates of the JFET pair.

21. The circuit of claim 18, wherein the sources of the JFET pair are connected to the bases of the BJT pair.

22. The circuit of claim 18, wherein the drains of the JFET pair are connected to variable resistors.

23. The circuit of claim 18, wherein the means for maintaining the JFET pair in the linear region of operation comprises means for biasing the drain current of the JFET pair at a fraction of Idss.

24. The circuit of claim 18, wherein a load resistor pair is connected to the collectors of the BJT pair.

* * * * *